(12) United States Patent
Wu

(10) Patent No.: US 9,273,909 B2
(45) Date of Patent: Mar. 1, 2016

(54) HEAT PIPE STRUCTURE, AND THERMAL MODULE AND ELECTRONIC DEVICE USING SAME

(75) Inventor: Chun-Ming Wu, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 250 days.

(21) Appl. No.: 13/592,351

(22) Filed: Aug. 23, 2012

(65) Prior Publication Data

US 2014/0055954 A1 Feb. 27, 2014

(51) Int. Cl.
*F28D 15/04* (2006.01)
*H01L 23/427* (2006.01)
*F28D 15/02* (2006.01)
*H01L 21/48* (2006.01)

(52) U.S. Cl.
CPC ............ *F28D 15/04* (2013.01); *F28D 15/0233* (2013.01); *H01L 23/427* (2013.01); *H01L 21/4882* (2013.01); *H01L 2924/0002* (2013.01)

(58) Field of Classification Search
CPC .................. G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00; F28D 15/04; F28D 15/0233; H01L 23/427; H01L 23/367; H01L 21/4882
USPC ................... 165/104.26, 104.33, 104.21, 128
See application file for complete search history.

(56) References Cited

U.S. PATENT DOCUMENTS

| | | | | |
|---|---|---|---|---|
| 3,746,081 | A * | 7/1973 | Corman | ............... F28D 15/046 165/104.26 |
| 4,640,347 | A * | 2/1987 | Grover et al. | ............ 165/104.26 |
| 6,508,302 | B2 * | 1/2003 | Ishida et al. | ............. 165/104.26 |
| 6,926,072 | B2 * | 8/2005 | Wert | ........................ 165/104.26 |
| 7,229,104 | B2 * | 6/2007 | Hsu | ...................... F28D 15/0283 165/104.26 |
| 7,594,537 | B2 * | 9/2009 | Hou et al. | ................ 165/104.26 |
| 8,857,502 | B2 * | 10/2014 | Huang | ..................... 165/104.26 |
| 2005/0225943 | A1 * | 10/2005 | Shih | ................... F28D 15/0233 361/700 |
| 2006/0289146 | A1 * | 12/2006 | Wu | ......................... 165/104.21 |
| 2007/0006993 | A1 * | 1/2007 | Meng et al. | ............. 165/104.26 |

(Continued)

*Primary Examiner* — Tho V Duong
*Assistant Examiner* — Aaron Isenstadt

(57) ABSTRACT

An electronic device has a heat source and a thermal module. The thermal module includes a plurality of radiating fins respectively provided with a through hole, and a heat pipe structure having a pipe body. The pipe body has a vaporizing section in contact with the heat source and a condensing section extended through the radiating fins via the through holes thereon. The vaporizing section has a first pipe thickness and is internally provided with a first wick structure to define a first flow channel. The condensing section has a second pipe thickness smaller than the first pipe thickness, and is internally provided along part of its length with at least one second wick structure to define at least one second flow channel communicating with the first flow channel.

16 Claims, 14 Drawing Sheets

(56) References Cited

U.S. PATENT DOCUMENTS

2007/0235165 A1* 10/2007 Liu .................. F28D 15/046
  165/104.26
2008/0078530 A1* 4/2008 Chang ............... F28D 15/043
  165/104.26
2008/0245511 A1* 10/2008 Lai ........................... 165/104.26
2009/0020268 A1* 1/2009 Chang .................. B23P 15/26
  165/104.26
2010/0132922 A1* 6/2010 Meyer, IV ........... F28D 15/0233
  165/104.19
2013/0048247 A1* 2/2013 Lin ...................... B21C 37/154
  165/104.26

* cited by examiner

HEAT PIPE STRUCTURE, AND THERMAL MODULE AND ELECTRONIC DEVICE USING SAME

FIELD OF THE INVENTION

The present invention relates to a heat pipe structure, and more particularly to a heat pipe structure for dissipating heat produced by a heat source in an electronic device. The present invention also relates to a thermal module using the above-mentioned heat pipe structure and an electronic device using such thermal module.

BACKGROUND OF THE INVENTION

Thanks to the constant progress in various technological fields, electronic elements in different electronic devices all have largely increased power and upgraded performance now. However, these electronic elements also produce a large amount of heat when they operate. The produced heat must be timely removed lest it should become accumulated in the electronic elements to result in raised temperature and adversely affected performance of the electronic elements. In some worse conditions, the accumulated heat would even cause failure or burnout of the electronic elements. To effectively solve the problem in connection with the heat dissipation of electronic elements, structures having better heat transfer efficiency, such as vapor chamber and thin heat pipe, have been successively introduced into market for use with heat sinks in an attempt to overcome at least the currently encountered heat dissipation-related problems.

The currently available thin heat pipe is formed by filling and sintering metal powder in a hollow space of a round pipe to form a wick structure on the round inner surface of the pipe, evacuating the pipe and then filling a working fluid in the pipe, and finally sealing and flattening the pipe to complete a thin heat pipe. It is noted, in the above-described thin heat pipe, the wick structure is distributed on the whole inner surface of a chamber formed in the thin heat pipe. When the working fluid is vaporized in the vaporizing section of the heat pipe, the vapor-phase working fluid diffuses to the condensing section at the other end of the heat pipe and is gradually cooled to finally become condensed into liquid-phase working fluid. With the help of the wick structure, the liquid-phase working fluid flows back to the vaporizing section again. However, since the chamber in the thin flat heat pipe is very narrow, the vapor-phase working fluid is hindered by the liquid-phase working fluid from smoothly and quickly flowing to the condensing section for cooling and dissipating heat.

Further, the wick structure in the condensing section forms a pressure resistance therein to adversely reduce the vapor-liquid circulation efficiency in the heat pipe, and part of the liquid-phase working fluid will become stagnated in the condensing section without flowing back to the vaporizing section to thereby largely reduce the heat transfer efficiency of the heat pipe.

Moreover, all the conventional thin heat pipes are manufactured to respectively have fixed cross sectional dimensions along their length and could not be configured according to actual needs to have different shapes and sizes at different positions, such as have one end with larger size and another end with smaller size, or have two equally sized ends but a gradually expanded or reduced middle portion. Besides, the wick structure, i.e. the sintered-powder structure, is always distributed on the whole inner surface of the conventional thin heat pipe. When the thin heat pipe is curved or bent to change its shape, the wick structure tends to be compressed or squeezed or even to separate from the inner surface of the thin heat pipe at the curved or bent position, which would no doubt largely reduce the heat transfer performance of the thin heat pipe. Since the wick structure is formed on the whole inner surface of the original round pipe without other changeful designs, when the round pipe is flattened to produce the thin heat pipe, the portions of the wick structure located at upper and lower parts of the inner surface of the thin heat pipe tend to become superposed and have increased thickness, which prevents the round heat pipe from being flattened by a largest possible extent and the flattening effect is limited.

The currently available vapor chamber includes a substantially rectangular case internally defining a chamber. A wick structure is formed on inner wall surfaces of the chamber and a working fluid is filled in the chamber. One side of the case is defined as a vaporizing area for attaching to a heat-producing element, such as a central processing unit (CPU), a south bridge chip or a north bridge chip, for absorbing the heat produced by the heat-producing element. The working fluid in a liquid phase located on the vaporizing area is heated and finally vaporized to become a vapor-phase working fluid, which moves and carries heat toward an opposite side of the case serving as a condensing area, at where the working fluid is cooled and converted into the liquid-phase working fluid again. The liquid-phase working fluid moves back to the vaporizing area under the effect of gravity or with the help of the wick structure to complete one cycle of vapor-liquid circulation in the vapor chamber and start another cycle. The vapor-liquid circulation in the vapor chamber continues to effectively achieve the purpose of lowering temperature and dissipating heat.

While the conventional vapor chamber can achieve the purpose of lowering temperature, it has another problem. That is, according to the working principle of the vapor chamber, the vaporizing area at one side of the case absorbs heat, which is transferred to the condensing area at the other side of the case by the working fluid in the chamber via change between vapor phase and liquid phase. More specifically, unlike the heat pipe that transfers heat to a distant position away from the heat source for dissipating, the vapor chamber achieves the heat dissipation effect simply by transferring heat from one side to the other side of the case instead of transferring the heat to a distant position, and is more suitable for uniform heat dissipation via a large surface area.

SUMMARY OF THE INVENTION

A primary object of the present invention is to provide a heat pipe structure that has upgraded heat transfer performance.

Another object of the present invention is to provide a heat pipe structure that has reduced thermal resistance.

A further object of the present invention is to provide a heat pipe structure that has improved anti-gravity capability to increase the heat transfer efficiency thereof.

A still further object of the present invention is to provide a heat pipe structure that provides the condensing section thereof with increased structural strength.

A still further object of the present invention is to provide a heat pipe structure that can reduce the occurrence of noise when the working fluid flows in the heat pipe.

A still further object of the present invention is to provide a thermal module that uses the above heat pipe structure, and to provide an electronic device that uses such thermal module.

To achieve the above and other objects, the heat pipe structure according to the present invention includes a pipe body having two opposite sealed ends, a vaporizing section, and a condensing section. The vaporizing section has a first outer surface defining a first pipe thickness, and a first inner surface having a first wick structure formed thereon to define a first flow channel in the vaporizing section. The condensing section has a second outer surface defining a second pipe thickness, which is smaller than the first pipe thickness defined by the first outer surface, and a second inner surface having at least a first side and a second side opposite to the first side. The condensing section is internally provided along a part of its length with at least one second wick structure, which is located between and connected to the first side and the second side of the second inner surface, so as to define at least one second flow channel in the condensing section between the first and the second side. And, the second flow channel each is communicable with the first flow channel.

To achieve the above and other objects, the thermal module according to the present invention includes the above-described heat pipe structure and a plurality of adjoining and sequentially connected radiating fins. A flow channel is defined between any two adjacent radiating fins, and the condensing section of the heat pipe structure is connected to the radiating fins.

To achieve the above and other objects, the electronic device according to the present invention includes the above-described thermal module to cool a heat source located on the electronic device. The vaporizing section of the heat pipe structure included in the thermal module is in contact with the heat source, so that the working fluid in the vaporizing section absorbs the heat produced by the heat source and is converted from liquid phase into vapor phase to flow toward and thereby carry heat to the condensing section, from where the heat is transferred to the radiating fins and finally dissipated into ambient air.

According to the present invention, the first inner surface can be a smooth surface or a rough surface provided with a plurality of grooves; and the pipe body at the vaporizing section can have a round, a semicircular, a letter-D, or a flat cross-sectional shape.

According to the present invention, the second inner surface can be a smooth surface, a rough surface provided with a plurality of grooves, or a coated surface; and the pipe body at the condensing section has a thin flat cross-sectional shape.

According to the present invention, the first flow channel has a cross-sectional area larger than a total cross-sectional area of the at least one second flow channel.

According to the present invention, the first and second wick structures can be sintered-powder structures, meshes, or fibers.

According to an embodiment of the present invention, the second inner surface further has a third side and a fourth side opposite to the third side, and there is only one second wick structure being also connected to the third side to thereby define only one second flow channel between the second wick structure and the fourth side of the second inner surface.

According to another embodiment of the present invention, the second inner surface further has a third side and a fourth side opposite to the third side, and there is only one second wick structure substantially located at a middle position between the third and the fourth side to thereby define two second flow channels between the second wick structure and the third side as well as between the second wick structure and the fourth side of the second inner surface.

According to a further embodiment of the present invention, the second inner surface further has a third side and a fourth side opposite to the third side, and there is a plurality of second wick structures spaced between the third and the fourth side. A first one of the second wick structures is also connected to the third side, a second one of the second wick structures is also connected to the fourth side, and a third one of the second wick structures is substantially located at a middle position between the third and the fourth side to thereby define one second flow channel between any two adjacent second wick structures.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
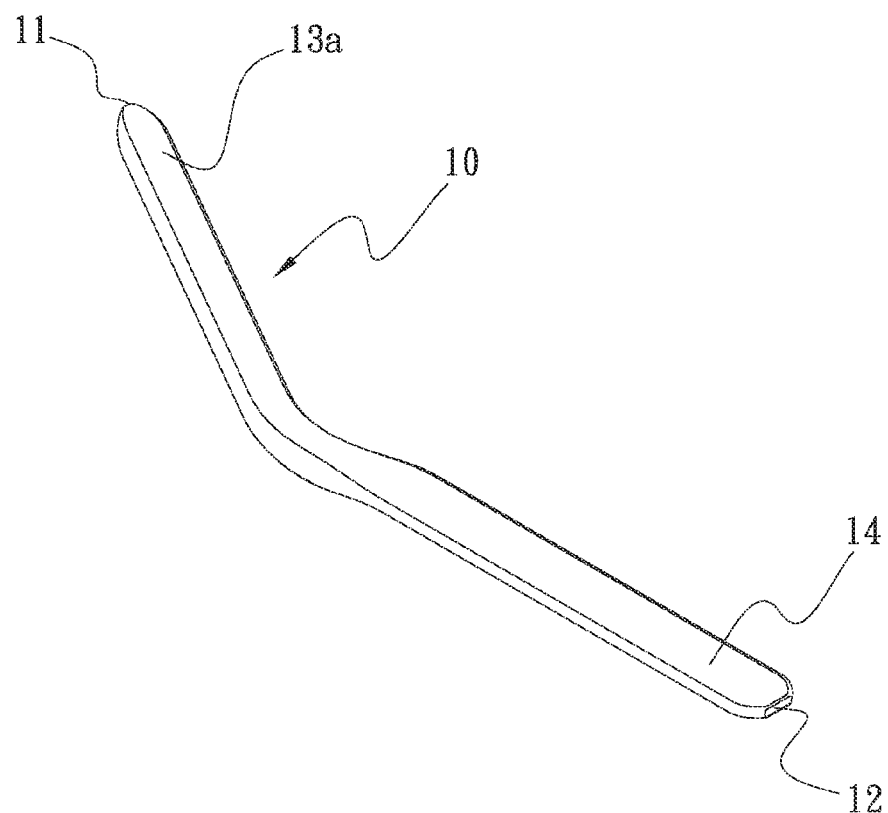
FIG. 1 is a perspective view of a heat pipe structure according to a preferred embodiment of the present invention.

The present invention will now be described with some preferred embodiments thereof and with reference to the accompanying drawings. For the purpose of easy to understand, elements that are the same in the preferred embodiments are denoted by the same reference numerals.

Please refer to FIGS. 1, 2, 3A and 3B. A heat pipe structure according to a preferred embodiment of the present invention includes a pipe body 10, which has a first sealed end 11, a second sealed end 12, a vaporizing section 13a, and a condensing section 14.

Figure 2:
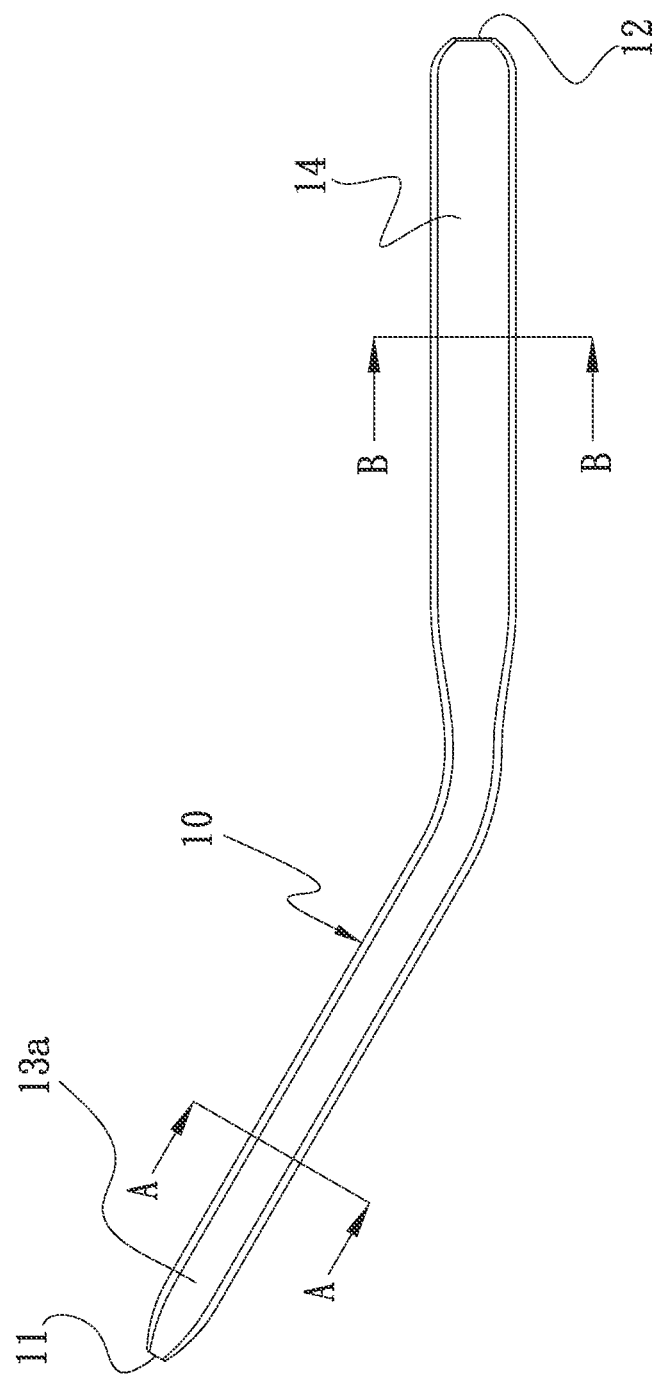
FIG. 2 is a top view of FIG. 1.
Figure 4A:
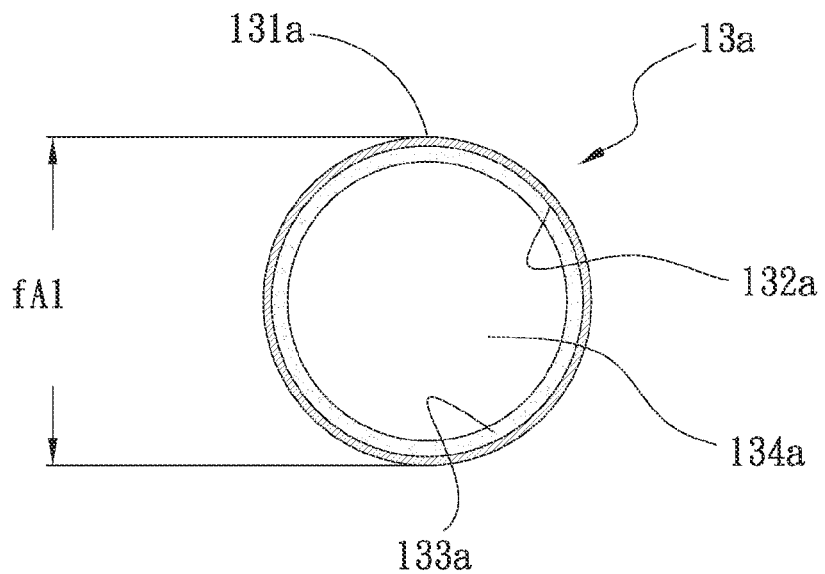
FIG. 4A is a cross-sectional view taken along line A-A of FIG. 2 showing a vaporizing section of the heat pipe structure according to the preferred embodiment of the present invention.

Please also refer to FIG. 4A, which is a cross-sectional view taken along line A-A of FIG. 2 showing the vaporizing section 13a of the heat pipe structure according to the preferred embodiment of the present invention. The vaporizing section 13a is substantially located near the first sealed end 11 and has a first outer surface 131a and a first inner surface 132a. The first outer surface 131a defines a first pipe thickness fA1 of the heat pipe structure, as indicated by the two extension lines in FIGS. 3A and 4A. The first pipe thickness fA1 will be described in more details below. The first inner surface 132a has a first wick structure 133a formed thereon. The first wick structure 133a can be continuously or non-continuously arranged on around the first inner surface 132a to define a first flow channel 134a in the vaporizing section 13a.

Figure 6A:
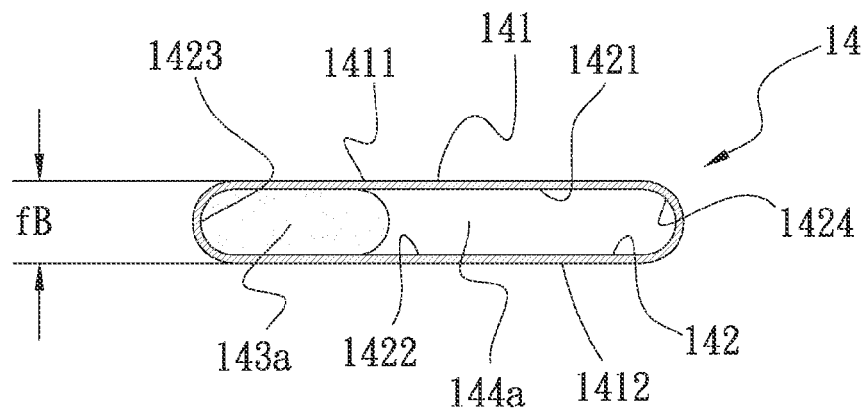
FIG. 6A is a cross-sectional view taken along line B-B of FIG. 2 showing the condensing section of the heat pipe structure according to the preferred embodiment of the present invention.

Please refer to FIG. 6A, which is a cross-sectional view taken along line B-B of FIG. 2 showing the condensing section 14 of the heat pipe structure according to the preferred embodiment of the present invention. The condensing section 14 is substantially located near the second sealed end 12 and has a second outer surface 141 and a second inner surface 142. The second outer surface 141 defines a second pipe thickness fB, as indicated by the two extension lines in FIGS. 3A and 6A. The second pipe thickness fB is smaller than the first pipe thickness fA1 defined by the first outer surface 131a, and will be described in more details below.

The second inner surface 142 includes a first side 1421, a second side 1422 opposite to the first side, a third side 1423, and a fourth side 1424 opposite to the third side. The condensing section 14 is internally provided along a part of its length with a second wick structure 143a, which is located between and connected to the first side 1421 and the second side 1422, and is also connected to the third side 1423. With this arrangement, a second flow channel 144a is defined in the condensing section 14 between the first and the second side 1421, 1422 to locate at one side of the wick structure 143a. Further, the second flow channel 144a is in fluid communication with the first flow channel 134a.

Figure 3A:
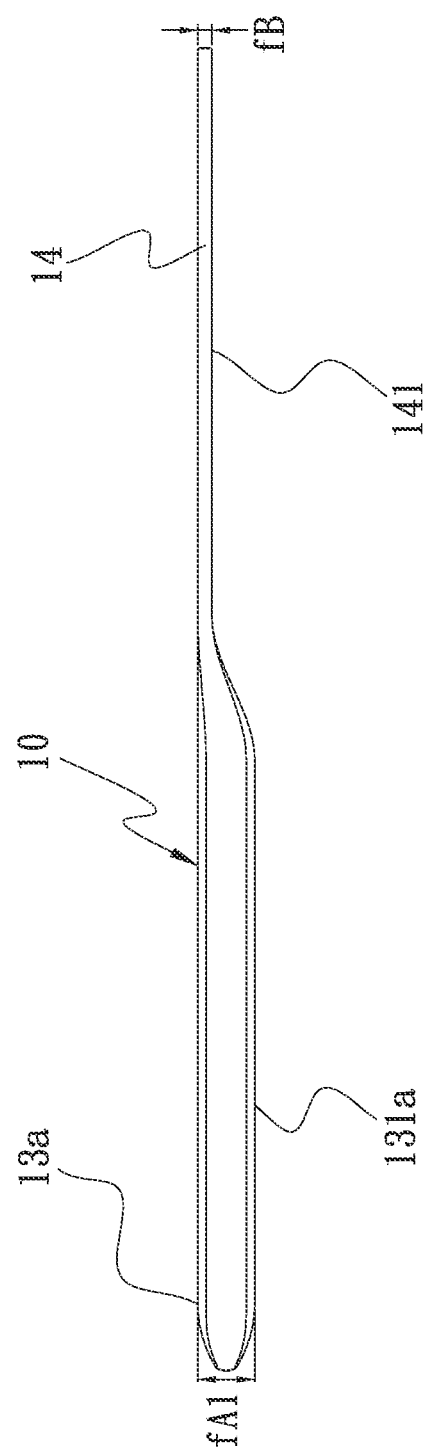
FIG. 3A is a side view of FIG. 1.
Figure 3B:
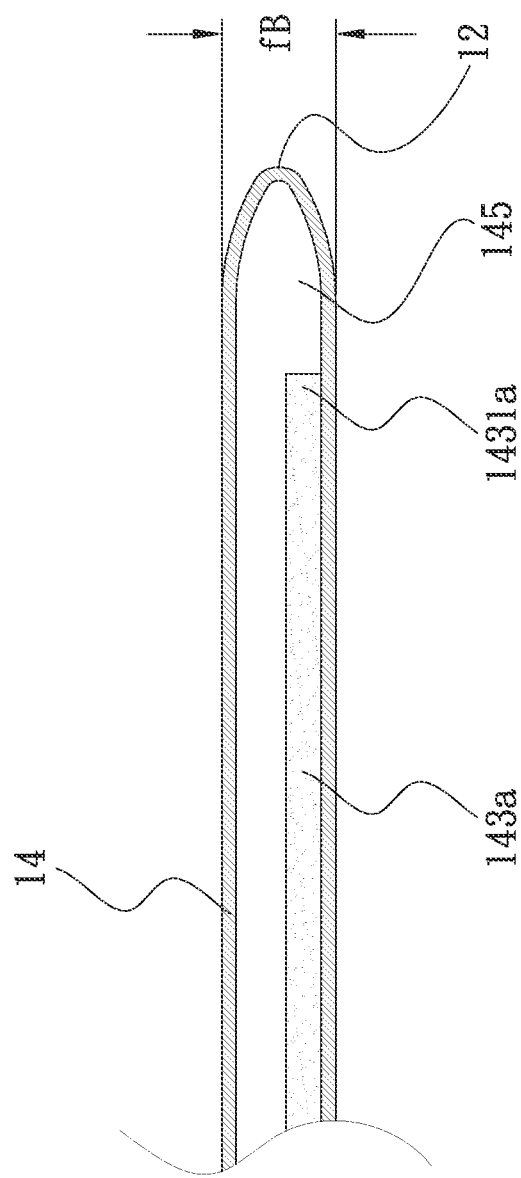
FIG. 3B is a fragmentary, enlarged sectional view of FIG. 3A showing a condensing section of the heat pipe structure according to the preferred embodiment of the present invention.

As can be seen in FIG. 3B, the second wick structure 143a in the condensing section 14 has a free end 1431a extended toward the second sealed end 12, such that a wick-free space 145 is defined between the free end 1431a of the second wick structure 143a and the second sealed end 12 to communicate with the second flow channel 144a. The wick-free space 145 enables a vapor-phase working fluid transferred to the condensing section 14 to be quickly condensed into a liquid-phase working fluid.

Some embodiments of the vaporizing section 13a and the condensing section 14 are described in more details below.

Figure 4B:
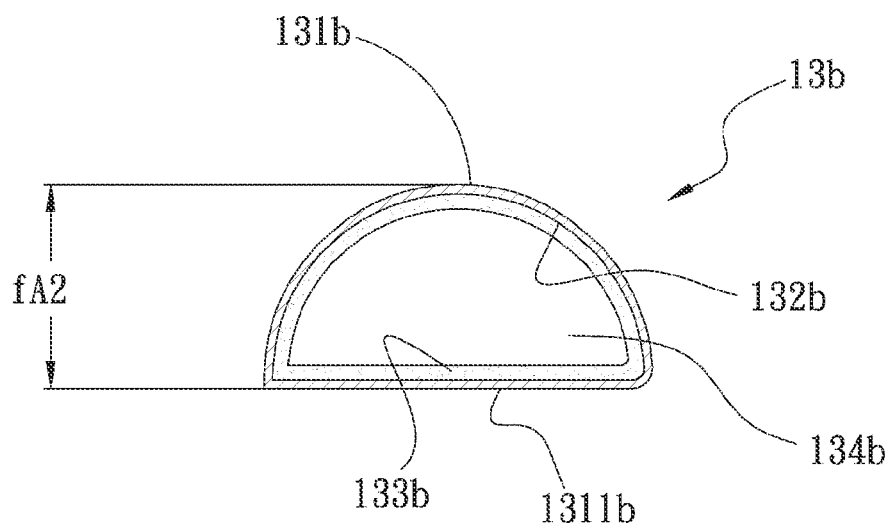
FIG. 4B is a cross-sectional view showing a first variation of the vaporizing section according to the present invention.

As shown in FIG. 4A, the vaporizing section 13a in the preferred embodiment has a round cross section and the first inner surface 132a is a smooth surface. In a first variation of the vaporizing section, denoted by reference numeral 13b as shown in FIG. 4B, it has a semicircular cross section. The semicircular vaporizing section 13b has a first outer surface 131b and a first inner surface 132b. The first outer surface 131b includes a curved portion and a flat portion 1311b, which together define a first pipe thickness fA2 of the heat pipe structure. The first inner surface 132b has a first wick structure 133b formed thereon. The first wick structure 133b can be continuously or non-continuously arranged on around the first inner surface 132b to define a first flow channel 134b in the vaporizing section 13b.

Figure 4C:
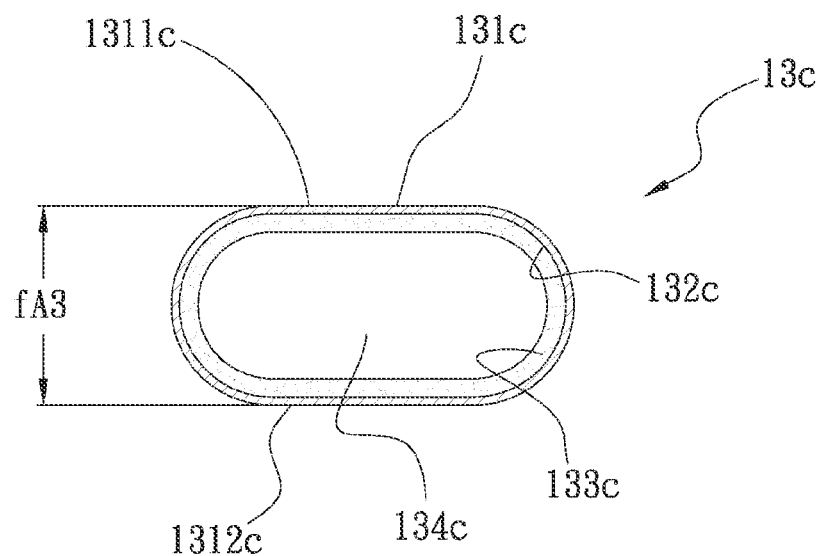
FIG. 4C is a cross-sectional view showing a second variation of the vaporizing section according to the present invention.

In a second variation of the vaporizing section, denoted by reference numeral 13c as shown in FIG. 4C, it has a flat cross section. The flat vaporizing section 13c has a first outer surface 131c and a first inner surface 132c. The first outer surface 131c includes a first flat portion 1311c and a second flat portion 1312c. The first and second flat portions 1311c, 1312c together define a first pipe thickness fA3 of the heat pipe structure. The first inner surface 132c has a first wick structure 133c formed thereon. The first wick structure 133c can be continuously or non-continuously arranged on around the first inner surface 132c to define a first flow channel 134c in the vaporizing section 13c.

Figure 5A:
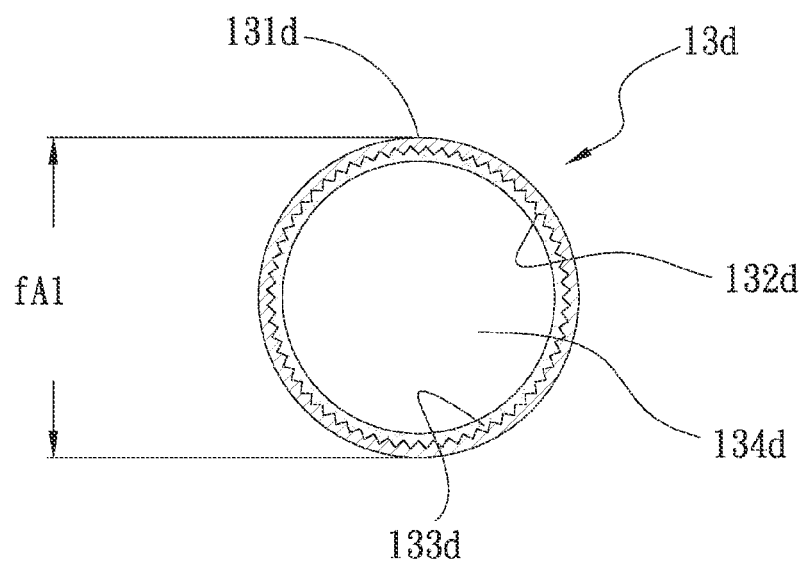
FIG. 5A is a cross-sectional view showing a third variation of the vaporizing section according to the present invention.

In a third variation of the vaporizing section, denoted by reference numeral 13d as shown in FIG. 5A, it has a round cross section. The vaporizing section 13d has a first outer surface 131d and a first inner surface 132d. The first inner surface 132d is provided with a plurality of grooves and therefore has a plurality of protrusions and recesses formed thereon. The first inner surface 132d also has a first wick structure 133d formed thereon. The first wick structure 133d can be continuously or non-continuously arranged on around the first inner surface 132d to define a first flow channel 134d in the vaporizing section 13d. The first outer surface 131d of the third variation of the vaporizing section 13d defines a first pipe thickness, which is the same as that defined by the first outer surface 131a of the vaporizing section 13a in the preferred embodiment of the present invention as shown in FIG. 4A and will be described in more details below.

Figure 5B:
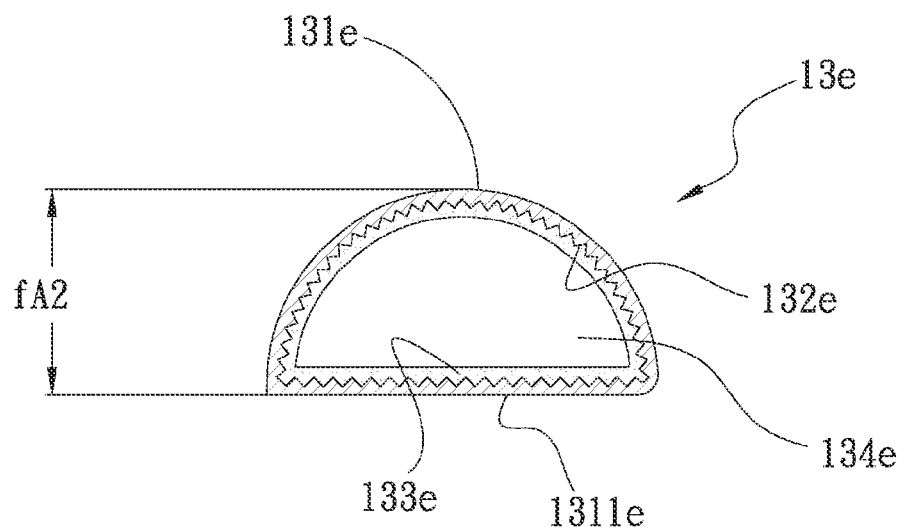
FIG. 5B is a cross-sectional view showing a fourth variation of the vaporizing section according to the present invention.

In a fourth variation of the vaporizing section, denoted by reference numeral 13e as shown in FIG. 5B, it has a semicircular cross section. The semicircular vaporizing section 13e has a first outer surface 131e and a first inner surface 132e. The first outer surface 131e includes a curved portion and a flat portion 1311e. The first inner surface 132e is provided with a plurality of grooves and therefore has a plurality of protrusions and recesses formed thereon. The first inner surface 132e also has a first wick structure 133e formed thereon. The first wick structure 133e can be continuously or non-continuously arranged on around the first inner surface 132e to define a first flow channel 134e in the vaporizing section 13e. The first outer surface 131e of the fourth variation of the vaporizing section 13e defines a first pipe thickness, which is the same as that defined by the first outer surface 131b of the first variation of the vaporizing section 13b as shown in FIG. 4B and will be described in more details below.

Figure 5C:
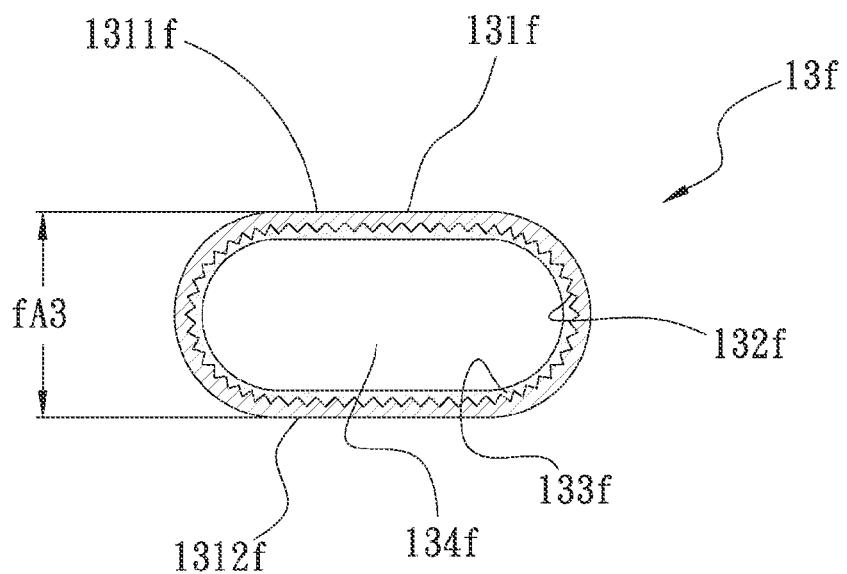
FIG. 5C is a cross-sectional view showing a fifth variation of the vaporizing section according to the present invention.

In a fifth variation of the vaporizing section, denoted by reference numeral 13f as shown in FIG. 5C, it has a flat cross section. The flat vaporizing section 13f has a first outer surface 131f and a first inner surface 132f. The first outer surface 131f includes a first flat portion 1311f and a second flat portion 1312f. The first inner surface 132f is provided with a plurality of grooves and therefore has a plurality of protrusions and recesses formed thereon. The first inner surface 132f also has a first wick structure 133f formed thereon. The first wick structure 133f can be continuously or non-continuously arranged on around the first inner surface 132f to define a first flow channel 134f in the vaporizing section 13f. The first outer surface 131f of the fifth variation of the vaporizing section 13f defines a first pipe thickness, which is the same as that defined by the first outer surface 131c of the second variation of the vaporizing section 13c as shown in FIG. 4C and will be described in more details below.

As shown in FIG. 6A, the condensing section 14 in the preferred embodiment of the present invention has a thin flat cross section. The second outer surface 141 includes an upper flat surface 1411 and a lower flat surface 1412. The second inner surface 142 is a smooth surface. The second wick structure 143a is connected to the first side 1421, the second side 1422 and the third side 1423 of the second inner surface 142. The second flow channel 144a is defined between the second wick structure 143a and the fourth side 1424 of the second inner surface 142.

Figure 6B:
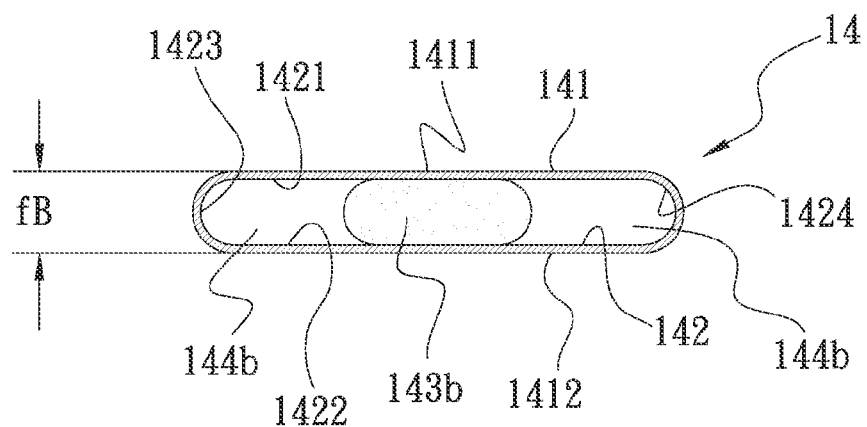
FIG. 6B is a cross-sectional view showing a first variation of the condensing section according to the present invention.

In a first variation of the condensing section, denoted by reference numeral 14 as shown in FIG. 6B, it internally has a second wick structure 143b arranged at a substantially middle position between the third side 1423 and the fourth side 1424 of the second inner surface 142 to connect with the first side 1421 and the second side 1422, such that two second flow channels 144b are separately defined between the second wick structure 143b and the third side 1423 as well as between the second wick structure 143b and the fourth side 1424.

Figure 6C:
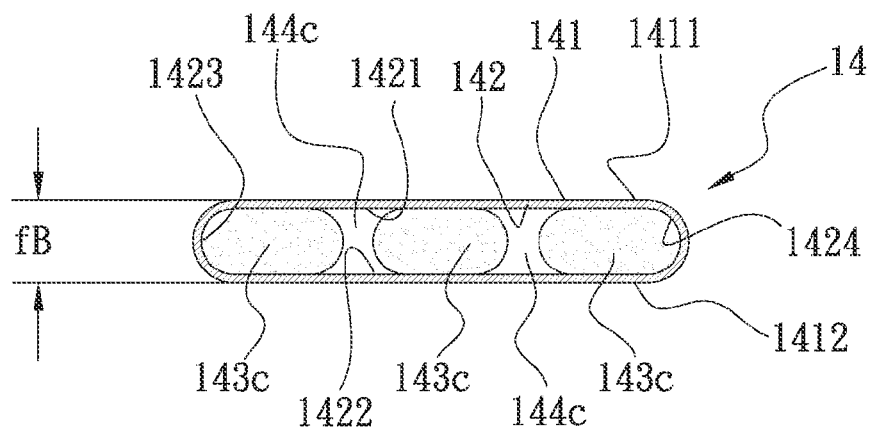
FIG. 6C is a cross-sectional view showing a second variation of the condensing section according to the present invention.

In a second variation of the condensing section, denoted by reference numeral 14 as shown in FIG. 6C, it internally has a plurality of second wick structures 143c arranged between the third side 1423 and the fourth side 1424 to space from one another and connect with the first side 1421 and the second side 1424. In the second variation illustrated in FIG. 6C, there are three separated second wick structures 143c. A first one of the second wick structures 143c is located adjacent to and connected to the third side 1423, a second one is located adjacent to and connected to the fourth side 1424, and a third one is substantially located at a middle position between the third side 1423 and the fourth side 1424. Therefore, two second flow channels 144c are defined in the condensing section 14 to respectively locate between two adjacent second wick structures 143c.

Figure 6D:
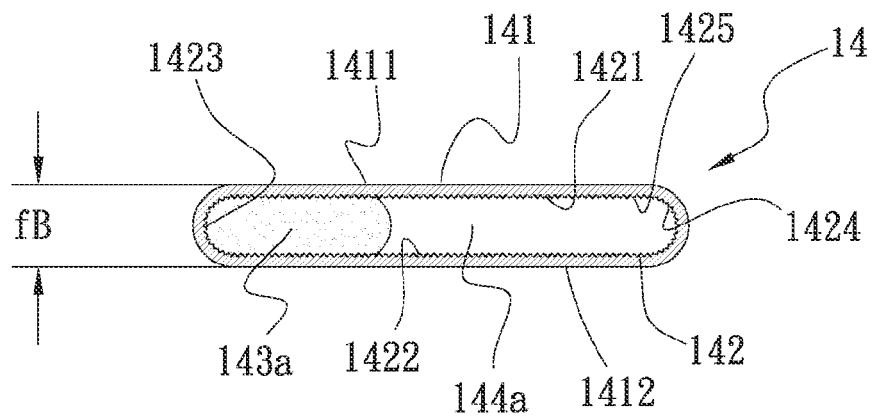
FIG. 6D is a cross-sectional view showing a third variation of the condensing section according to the present invention.
Figure 6E:
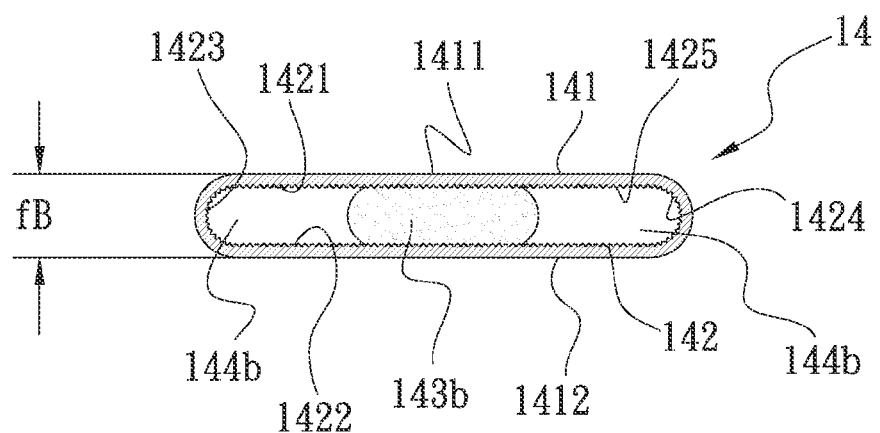
FIG. 6E is a cross-sectional view showing a fourth variation of the condensing section according to the present invention.
Figure 6F:
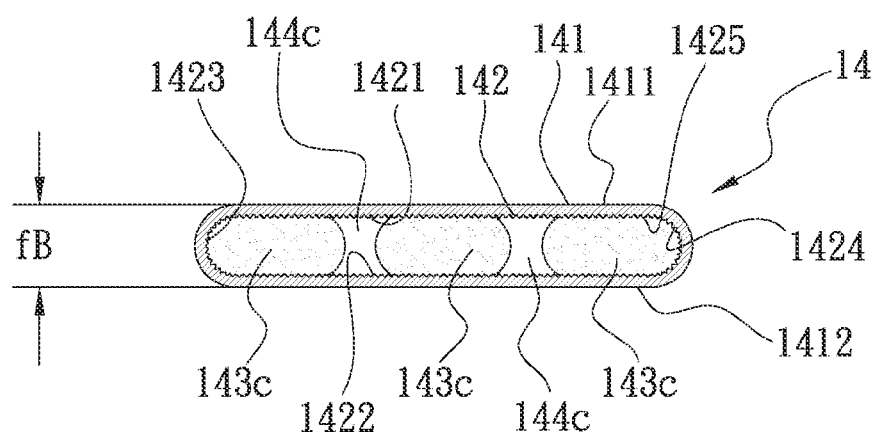
FIG. 6F is a cross-sectional view showing a fifth variation of the condensing section according to the present invention.

FIGS. 6D, 6E and 6F respectively show a third, a fourth and a fifth variation of the condensing section 14. The condensing section 14 in the third, the fourth and the fifth variation are generally structurally similar to those shown in FIGS. 6A, 6B and 6C, except that their all have a second inner surface 142 provided with a plurality of grooves 1425.

Moreover, it is understood the second wick structures 143a~143c in the condensing section 14 may have a quantity not necessarily limited to that shown in FIGS. 6A to 6F. Instead, the quantity of the second wick structures may be determined according to an overall width of the condensing section 14 on the pipe body 10, the required heat transfer efficiency, and the required vapor-liquid circulation efficiency for the heat pipe structure.

The first wick structure 133a~133f and the second wick structures 143a~143c have flow-guiding capability and provide more flow-back channels in the pipe body 10. Since the condensing section 14 has a relatively small thickness and a substantially flat shape, the second wick structures 143a~143c connected to between the first side 1421 and the second side 1422 of the second inner surface 142 advantageously provide the condensing section 14 with good supporting effect and prevent the condensing section 14 from becoming collapsed. Substantially, the first wick structure 133a~133f and the second wick structures 143a~143c can be meshes, fibers, sintered-powder structures, or a combination thereof. Further, the first wick structure 133a~133f may have a volume larger than a total volume of the second wick structures 143a~143c.

The above-mentioned first pipe thickness fA1, fA2, fA3 and second pipe thickness fB are described in more details below.

Please refer to FIGS. 4A and 5A. Since the vaporizing section 13a, 13d has a round cross section, the first pipe thickness fA1 is the length of a maximum outer diameter defined by the first outer surface 131a, 131d.

Please refer to FIGS. 4B and 5B. Since the vaporizing section 13b, 13e has a semicircular cross section, the first pipe thickness fA2 is the length of a maximum radius defined by the first outer surface 131b, 131e.

Please refer to FIGS. 4C and 5C. Since the vaporizing section 13c, 13f has a flat cross section, the first pipe thickness fA3 is the maximum length between the first flat surface 1311c, 1311f and the second flat surface 1312c, 1312f of the first outer surface 131c, 131f.

Please also refer to FIGS. 6A to 6F. Since the condensing section 14 has a thin flat cross section, the second pipe thickness fB is the maximum length between the upper flat surface 1411 and the lower flat surface 1412.

The first pipe thickness fA1, fA2, fA3 can be, for example but not limited to, larger than or equal to 3 mm; and the second pipe thickness fB can be, for example but not limited to, smaller than or equal to 2.5 mm.

The first flow channel 134a~134f has a cross-sectional area larger than that of the second flow channel 144a or larger than a total cross-sectional area of two or more second flow channels 144b, 144c.

Figure 7A:
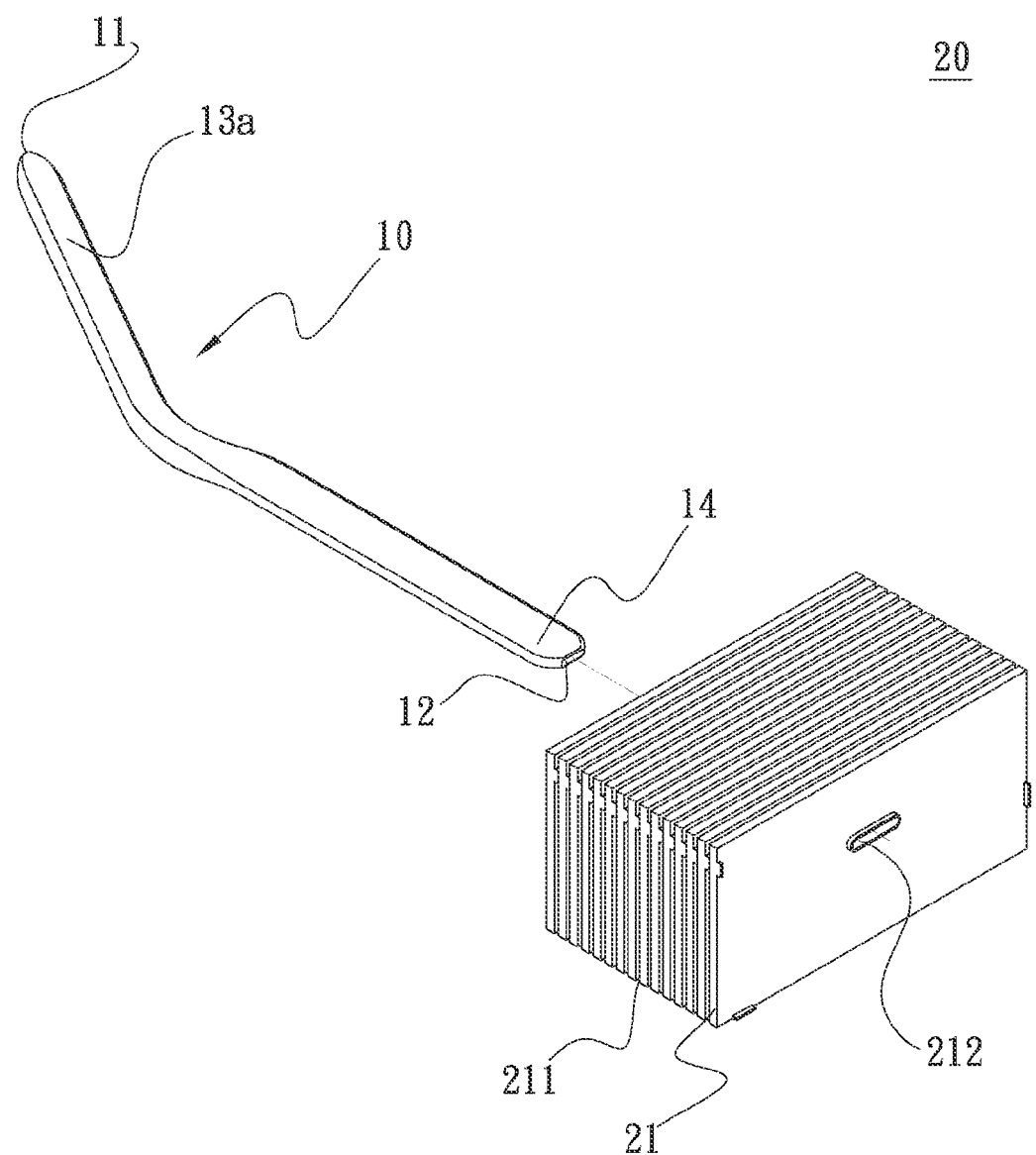
FIG. 7A is an exploded perspective view of a thermal module according to the present invention.
Figure 7B:
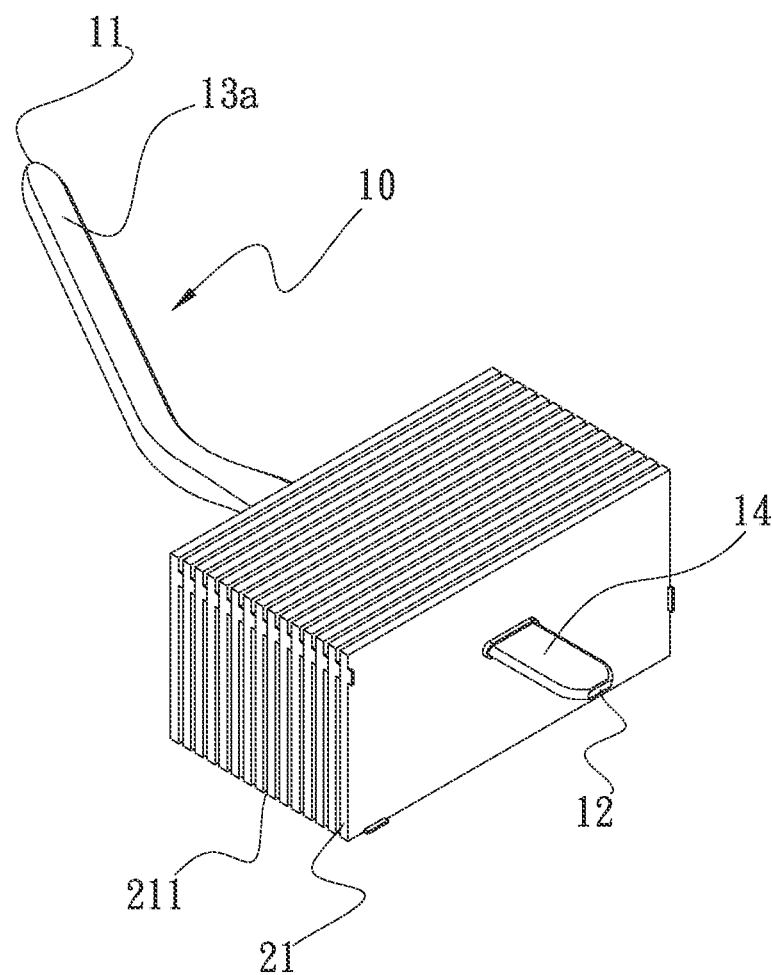
FIG. 7B is an assembled view of FIG. 7A.

FIGS. 7A and 7B are exploded and assembled perspective views, respectively, of a thermal module 20 according to an embodiment of the present invention that includes a heat pipe structure according to any of the above-described embodiments or variations thereof and a plurality of adjoining and sequentially connected radiating fins 21. A flow channel 211 is defined between any two adjacent radiating fins 21, and at least one through hole 212 is provided on each of the radiating fins 21. The condensing section 14 of the pipe body 10 of the heat pipe structure is sequentially extended through the holes 212 on the radiating fins 21, so that the radiating fins 21 are connected to the condensing section 14.

However, it is understood the condensing section 14 can be connected to the radiating fins 21 in other manners different from that described above. For example, the condensing section 14 can be directly attached to the radiating fins 21 of the thermal module 20. Alternatively, the radiating fins 21 of the thermal module 20 can be respectively provided with a slot and the condensing section 14 can be correspondingly engaged with the slots on the radiating fins 21.

Figure 8A:
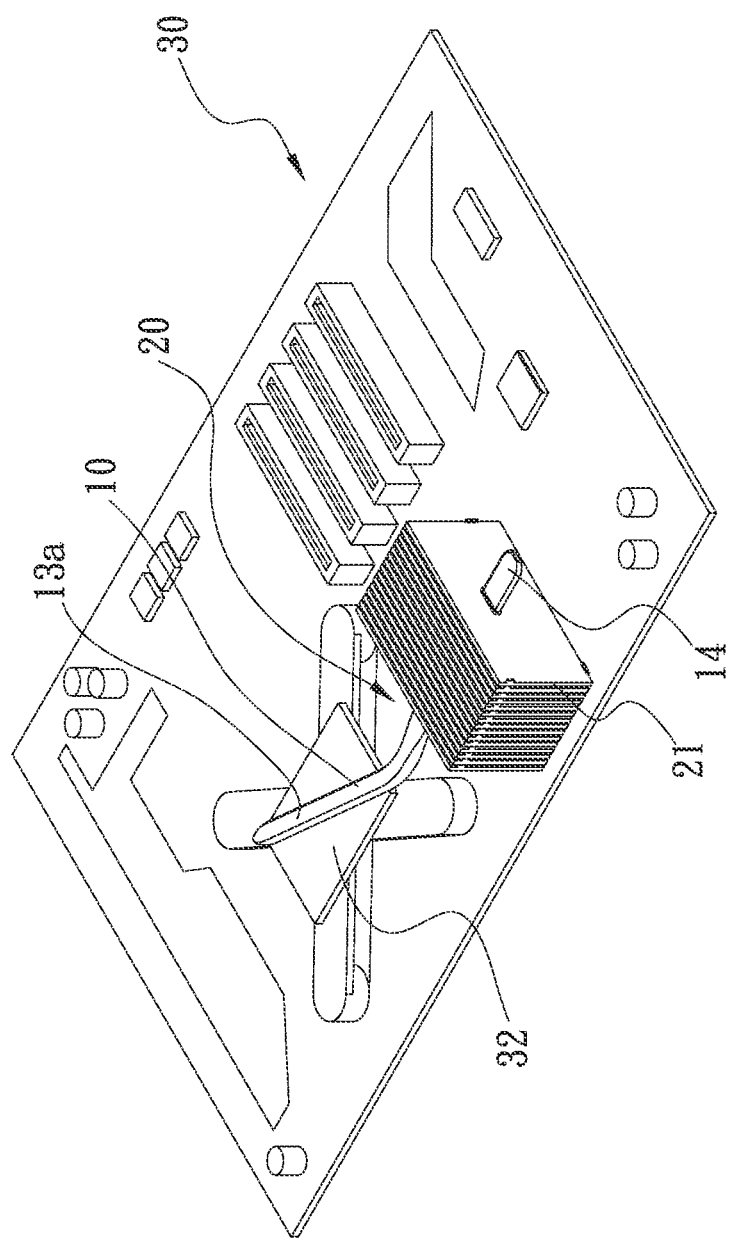
FIG. 8A is a top perspective view of an electronic device using the thermal module of the present invention.
Figure 8B:
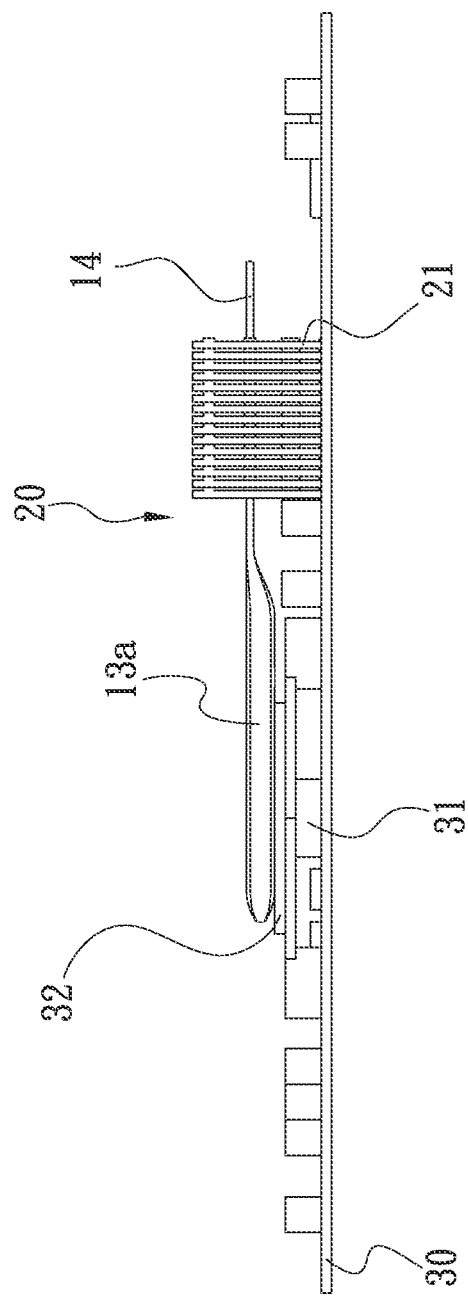
FIG. 8B is a side view of FIG. 8A.

FIGS. 8A and 8B are top perspective view and side view, respectively, of an electronic device 30 according to an embodiment of the present invention, which may be, for example, a circuit board having a heat source 31 located thereon, as can be seen in FIG. 8B. The heat source 31 may be, for example, a central processing unit (CPU), a microcontroller (MCU), a south bridge chip, a north bridge chip, a communication microcontroller or the like. The electronic device 30 is provided with the above-described thermal module 20, such that the vaporizing section 13a of the pipe body 10 is fixedly located above and in contact with the heat source 31 via a fixing member 32. The working fluid in the pipe body 10 is vaporized at the vaporizing section 13a that contacts with the heat source 31 on the electronic device 30, so that heat from the heat source 31 is transferred by the vapor-phase working fluid to the condensing section 14, at where the heat is further transferred to the radiating fins 21 to dissipate into ambient air and the vapor-phase working fluid is condensed into liquid-phase working fluid to flow back to the vaporizing section 13a via the wick structures in the pipe body 10 to complete one cycle of vapor-liquid circulation in the heat pipe structure.

The operation of the heat pipe structure of the present invention is now described with the above-mentioned embodiment of the electronic device 30.

In practical implementation of the present invention, the pipe body 10 is internally filled with a working fluid that can be easily vaporized to facilitate heat transfer and removal. The working fluid can include, but not limited to, purified water, inorganic compounds, alcohol, ketones, liquid metals, coolant, organic compounds, or any mixture thereof.

When the heat source 31 produces heat, the produced heat is transferred to the vaporizing section 13a of the pipe body 10, and the originally liquid-phase working fluid in the vaporizing section 13a absorbs the heat transferred to the vaporizing section 13a and is finally converted into vapor-phase working fluid. The vapor-phase working fluid flows toward the condensing section 14 while carries heat thereto. The heat carried to the condensing section 14 is transferred to the radiating fins 21 and is dissipated into ambient air therefrom. With the dissipation of heat, the vapor-phase working fluid is quickly condensed into liquid-phase working fluid again. With the help of the first wick structure 133a and the second wick structure 143a, the liquid-phase working fluid quickly flows back to the vaporizing section 13a to start another cycle of vapor-liquid circulation in the pipe body 10.

Since the first pipe thickness fA1 at the vaporizing section 13a of the pipe body 10 is larger than the second pipe thickness fB at the condensing section 14, the pipe body 10 internally provides a relatively large space at the vaporizing section 13a to allow the working fluid to quickly convert from liquid phase into vapor phase; and since the first flow channel 134a has a cross-sectional area larger than that of the second flow channel 144a, the vapor-phase working fluid can flow in the first flow channel 134a at a relatively quick speed. On the other hand, since the second flow channel 144a in the condensing section 14 has a relatively small cross-sectional area to thereby produce a relatively large thermal resistance, which has adverse influence on the transfer of heat to the condensing section 14 by the vapor-phase working fluid. However, by providing the first and the second wick structures 133a, 143a, the thermal resistance in the pipe body 10 can be effectively reduced and the liquid-phase working fluid can more quickly flow back to the vaporizing section 13a to enabled increased vapor-liquid circulation efficiency and upgraded anti-gravity effect in heat transfer.

Moreover, by forming the first wick structure 133a on around the first inner surface 132a in the vaporizing section 13a and by forming the second wick structure 143a on around the second inner surface 142 in the condensing section 14 between the first side 1421 and the second side 1422, it is able to reduce the occurrence of noise when the vapor-phase working fluid flows toward the condensing section 14.

In conclusion, the heat pipe structure according to the present invention has the following advantages: (1) increased heat transfer performance; (2) reduced thermal resistance in the pipe body; (3) upgraded anti-gravity effect to enable heat transfer over a long distance, i.e. allowing extended pipe body length; (4) giving the condensing section improved structural strength; and (5) reduced occurrence of noise in the pipe body.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A heat pipe structure, comprising a hollow pipe body including:
    a first sealed end;
    a second sealed end;
    a vaporizing section, a condensing section and a reducing section being provided between the vaporizing section and the condensing section, all three sections being between the first sealed end and the second sealed end;
    the vaporizing section having a first outer surface and a first inner surface; the first outer surface having a first planar top side and a first planar bottom side to define a vaporizing section thickness extending the full length of the vaporizing section, and the first inner surface having a first wick structure formed thereon; wherein the first wick structure can be continuously or non-continuously arranged on or around the first inner surface to define a first flow channel in the vaporizing section; and
    the condensing section having a second outer surface and a second inner surface; the second outer surface having a second planar top side and a second planar bottom side to define a condensing section thickness extending the full length of the condensing section, which is smaller than the vaporizing section thickness defined by the first top side and the first bottom side of the first outer surface, and the second inner surface having at least a first side and a second side opposite to the first side; the condensing section being internally provided along a part of its length with at least one second wick structure, which is located between and connected to the first side and the second side of the second inner surface, so as to define at least one second flow channel in the condensing section between the first and the second side; and the second flow channel being communicable with the first flow channel;
    wherein the reducing section has a reducing flow channel and a reducing section thickness, the reducing flow channel being communicable with the first flow channel and the second flow channel, and the reducing section extends and reduces the thickness from the vaporizing section thickness to the condensing section thickness.

2. The heat pipe structure as claimed in claim 1, wherein the reducing section is curved.

3. The heat pipe structure as claimed in claim 1, wherein at least one of the first inner surface and the second inner surface is selected from the group consisting of a smooth surface and a rough surface provided with a plurality of grooves.

4. The heat pipe structure as claimed in claim 1, wherein the vaporizing section has a cross-sectional shape selected from the group consisting of a round shape, a semicircular shape, and a flat shape.

5. The heat pipe structure as claimed in claim 1, wherein the condensing section has a thin flat cross-sectional shape.

6. The heat pipe structure as claimed in claim 1, wherein the first flow channel has a cross-sectional area larger than that of the second flow channel.

7. The heat pipe structure as claimed in claim 1, wherein the first and the second wick structures are respectively selected from the group consisting of sintered-powder structures, meshes, fibers, and a combination thereof.

8. The heat pipe structure as claimed in claim 1, wherein the second inner surface further has a third side and a fourth side opposite to the third side, and there is only one second wick structure being also connected to the third side to thereby define only one second flow channel between the second wick structure and the fourth side of the second inner surface.

9. The heat pipe structure as claimed in claim 1, wherein the second inner surface further has a third side and a fourth side opposite to the third side, and there is only one second wick structure substantially located at a middle position between the third and the fourth side to thereby define two second flow channels between the second wick structure and the third side as well as between the second wick structure and the fourth side of the second inner surface.

10. The heat pipe structure as claimed in claim 1, wherein the second inner surface further has a third side and a fourth side opposite to the third side, and there is a plurality of second wick structures spaced between the third and the fourth side; and wherein a first one of the second wick structures is also connected to the third side, a second one of the second wick structures is also connected to the fourth side, and a third one of the second wick structures is substantially located at a middle position between the third and the fourth side to thereby define one second flow channel between any two adjacent second wick structures.

11. The heat pipe structure as claimed in claim 1, wherein the first wick structure in the vaporizing section has a volume larger than that of the second wick structure.

12. The heat pipe structure as claimed in claim 1, wherein the at least one second wick structure in the condensing section has a free end extending toward the second sealed end of the pipe body, such that a wick-free space is formed between the free end of the second wick structure and the second sealed end of the pipe body, and the wick-free space being communicable with the at least one second flow channel.

13. A thermal module, comprising:
a plurality of adjoining and sequentially connected radiating fins, such that a flow channel is defined between any two adjacent radiating fins; and
a heat pipe structure including a hollow pipe body comprising:
a first sealed end;
a second sealed end;
a vaporizing section, a condensing section and a reducing section being provided between the vaporizing section and the condensing section, all three sections being between the first and second sealed ends;
the vaporizing section having a first outer surface and a first inner surface; the first outer surface having a first planar top side and a first planar bottom side to define a vaporizing section thickness extending the full length of the vaporizing section, and the first inner surface having a first wick structure formed thereon; wherein the first wick structure can be continuously or non-continuously arranged on or around the first inner surface to define a first flow channel in the vaporizing section; and
the condensing section connected to the radiating fins, and having a second outer surface and a second inner surface; the second outer surface having a second planar top side and a second planar bottom side to define a condensing section thickness extending the full length of the condensing section, which is smaller than the vaporizing section thickness defined by the first top side and the first bottom side of the first outer surface, and the second inner surface having at least a first side and a second side opposite to the first side; the condensing section being internally provided along a part of its length with at least one second wick structure, which is located between and connected to the first side and the second side of the second inner surface, so as to define at least one second flow channel in the condensing section between the first and the second side; and the second flow channel being communicable with the first flow channel;
wherein the reducing section has a reducing flow channel and a reducing section thickness, the reducing flow channel being communicable with the first flow channel and the second flow channel, and the reducing section extends and reduces the thickness from the vaporizing section thickness to the condensing section thickness.

14. An electronic device having at least one heat source located thereon, comprising a thermal module, which includes:
a plurality of adjoining and sequentially connected radiating fins, such that a flow channel is defined between any two adjacent radiating fins; and
a heat pipe structure including a hollow pipe body comprising:
a first sealed end;
a second sealed end;
a vaporizing section, a condensing section and a reducing section being provided between the vaporizing section and the condensing section, all three sections being between the first and second sealed ends;
the vaporizing section attached to the heat source, and having a first outer surface and a first inner surface; the first outer surface having a first planar top side and a first planar bottom side to define a vaporizing section thickness extending the full length of the vaporizing section, and the first inner surface having a first wick structure formed thereon; wherein the first wick structure can be continuously or non-continuously arranged on or around the first inner surface to define a first flow channel in the vaporizing section; and
the condensing section connected to the radiating fins, and having a second outer surface and a second inner surface; the second outer surface having a second planar top side and a second planar bottom side to define a condensing section thickness extending the full length of the condensing section, which is smaller than the vaporizing section thickness defined by the first top side and the first bottom side of the first outer surface, and the second inner surface having at least a first side and a second side opposite to the first side; the condensing section being internally provided along a part of its length with at least one second wick structure, which is located between and connected to the first side and the second side of the second inner surface, so as to define at least one second flow channel in the condensing section between the first and the second side; and the second flow channel being communicable with the first flow channel;
wherein the reducing section has a reducing flow channel and a reducing section thickness, the reducing flow channel being communicable with the first flow channel and the second flow channel, and the reducing section extends and reduces the thickness from the vaporizing section thickness to the condensing section thickness.

15. The thermal as claimed in claim 13 wherein the reducing section is curved.

16. The electronic device as claimed in claim 13 wherein the reducing section is curved.

* * * * *